United States Patent
Nishida et al.

(10) Patent No.: US 6,514,427 B2
(45) Date of Patent: Feb. 4, 2003

(54) PIEZOELECTRIC CERAMIC COMPOSITION AND PIEZOELECTRIC ELEMENT CONTAINING THE SAME

(75) Inventors: Masamitsu Nishida, Osaka (JP); Keiichi Takahashi, Nishinomiya (JP); Kojiro Okuyama, Ikoma (JP); Junichi Kato, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/008,890

(22) Filed: Nov. 13, 2001

(65) Prior Publication Data

US 2002/0066882 A1 Jun. 6, 2002

(30) Foreign Application Priority Data

Nov. 15, 2000 (JP) ......................... 2000-348445

(51) Int. Cl.$^7$ ................... C04B 35/00; C04B 35/462; C04B 35/475

(52) U.S. Cl. .................. 252/62.9 R; 252/62.9 PZ; 501/134

(58) Field of Search .................. 252/62.9 R, 62.9 PZ; 501/134

(56) References Cited

U.S. PATENT DOCUMENTS 5,637,542 A * 6/1997 Takenaka .................. 501/134
6,080,327 A * 6/2000 Takenaka et al. ...... 252/62.9 R
6,083,415 A 7/2000 Kimura et al.

FOREIGN PATENT DOCUMENTS

| JP | 7-82024 | 3/1995 |
| JP | 11 228-226 | 8/1999 |
| JP | 11-228228 | 8/1999 |

* cited by examiner

*Primary Examiner*—Elizabeth D. Wood
(74) *Attorney, Agent, or Firm*—Merchant & Gould P.C.

(57) ABSTRACT

The present invention provides a piezoelectric ceramic composition that can be manufactured easily by an ordinary sintering method, is free from lead, and has a large frequency constant, a small grain size, and a high mechanical Q. This composition is expressed by a formula of $(1-v-w)[(Li_{1-x-y}Na_xK_y)_zRO_3] \cdot vLMnO_3 \cdot wBi_{1/2}Na_{1/2}TiO_3$. The present invention also provides a piezoelectric ceramic composition, including at least one selected from Mn, Cr, and Co that is added to a composition expressed by a formula of $(Li_{1-x-y}Na_xK_y)_zRO_3$ so as to have a ratio thereof to the whole of 0.01 to 1 wt % in terms of $MnO_2$, $Cr_2O_3$, and CoO, respectively. In the above-mentioned formulae, $0 \leq v \leq 0.05$, $0 \leq 0.2$, $v+w>0$, $0.2 \leq x \leq 0.97$, $0 \leq y \leq 0.8$, $x+y \geq 0.8$, $0.98 \leq z \leq 1$, L indicates at least one element selected from the rare earth elements, and R denotes at least one element selected from Nb, Ta, and Sb.

19 Claims, 1 Drawing Sheet

PIEZOELECTRIC CERAMIC COMPOSITION AND PIEZOELECTRIC ELEMENT CONTAINING THE SAME

BACKGROUND OF THE INVENTION

1. Field of the Invention

The present invention relates generally to piezoelectric ceramic compositions that are useful as materials for piezoelectric elements such as piezoelectric ceramic filters, piezoelectric ceramic vibrators, actuators, piezoelectric transformers, various types of sensors, or the like.

2. Related Background Art

Conventionally, as piezoelectric ceramic materials, lead titanate-based ceramics containing $PbTiO_3$ as a main component, lead zirconate titanate-based ceramics containing $Pb(Ti, Zr)O_3$ as a main component, and a multicomponent piezoelectric ceramic that includes some kinds of complex perovskite compositions, for example, $Pb(Mg_{1/3}Nb_{2/3})O_3$, $Pb(Ni_{1/3}Nb_{2/3})O_3$ have been used. With these compositions, piezoelectric ceramics having different characteristics in accordance with the intended uses can be obtained through the suitable selection of a composition ratio of the components thereof. These piezoelectric ceramics are used for ceramic filters, piezobuzzers, piezoelectric spark plugs, ultrasonic piezoelectric transducers, or the like.

However, conventional lead zirconate titanate piezoelectric ceramics have a small frequency constant that is about 2000 Hz·m. Hence, when using such a piezoelectric ceramics, a resonator in which thickness longitudinal vibration occurs in the frequency band of about 10 MHz or higher has an element thickness of 0.2 mm or less, which makes the manufacture thereof difficult. In addition, the above-mentioned conventional materials contain a large amount of lead as a main component, which is not desirable from the viewpoint of environmental protection. The above-mentioned conventional materials have large grain sizes and thus it is difficult to use them for vibrators used at high frequencies. Furthermore, it is desired that piezoelectric ceramics have a high mechanical quality factor Qm (hereinafter referred to as "mechanical Q").

SUMMARY OF THE INVENTION

Hence, an object of the present invention is to provide a piezoelectric ceramic composition that is manufactured easily by an ordinary sintering method, is free from lead, and has a large frequency constant, a small grain size, and a high mechanical Q at least in its preferable embodiments. Another object of the present invention is to provide a piezoelectric element including this piezoelectric ceramic composition.

From one aspect of the present invention, a first piezoelectric ceramic composition is expressed by a formula of $(1-v-w)[(Li_{1-x-y}Na_xK_y)_zRO_3]\cdot vLMnO_3\cdot wBi_{1/2}Na_{1/2}TiO_3$.

In the above formula, $0 \leq v \leq 0.05$, $0 \leq w \leq 0.2$, $v+w>0$, $0.2 \leq x \leq 0.97$, $0 \leq y \leq 0.8$, $x+y \geq 0.8$, $0.98 \leq z \leq 1$, L indicates at least one element selected from the rare earth elements (Sc, Y, and lanthanide series elements), and R denotes at least one element selected from Nb, Ta, and Sb.

From another aspect of the present invention, a second piezoelectric ceramic composition includes at least one selected from Mn, Cr, and Co that is added to a composition expressed by a formula of $(Li_{1-x-y}Na_xK_y)_zRO_3$ so as to have a ratio thereof to the whole of 0.01 to 1 wt % in terms of $MnO_2$, $Cr_2O_3$, and CoO, respectively.

In the formula, x, y, x+y, and z are values in the same range as in the above, and L and R are the same elements as those described above.

The present invention provides a piezoelectric element including the piezoelectric ceramic composition.

DETAILED DESCRIPTION OF THE INVENTION

Preferable embodiments of the present invention are described as follows.

In the first piezoelectric ceramic composition of the present invention, when $0.001 \leq v \leq 0.05$, an effect of improving the mechanical Q can be obtained to a sufficiently high degree. In a use, for example, in a vibrator, it is desirable that the mechanical Q be high to reduce losses. The value of v is further preferably at least 0.005 and particularly preferably 0.03 or lower. When $v>0$, w may be zero (w=0).

When $0.001 \leq w \leq 0.2$, the effect of improving the mechanical Q can be obtained to a sufficiently high degree as in the above. The value of w is further preferably at least 0.02 and particularly preferably 0.1 or lower. When $w>0$, v may be zero (v=0). In addition, the values of v and w may be $0.001 \leq v \leq 0.05$ and $0.001 \leq w \leq 0.2$.

As alkali elements, Na is essential, but only either Li or K may be contained. When K is not contained (y=0), $0.80 \leq x \leq 0.97$ is preferable in $Li_{1-x}Na_x$. This is because the sintering characteristics may deteriorate slightly when the value of x is out of this range. The value of x is further preferably at least 0.83 and particularly preferably 0.93 or lower.

When Li is not contained (x+y=1), $0.2 \leq x \leq 0.8$ and $0.2 \leq y \leq 0.8$ are preferable in $Na_xK_y$. This is because the sintering characteristics may deteriorate slightly when the values of x and y are out of these ranges. Both values of x and y are further preferably at least 0.4 and particularly preferably 0.6 or lower.

When the value of z is lower than 0.98, the effect of improving mechanical Q is not obtained to a sufficiently high degree. Hence, the value of z was set to be at least 0.98. In this case, the value of z is set to 1 or lower, and thereby it is intended to produce no excess alkali compound. Moisture resistance of ceramics to be obtained is influenced on their electrical properties if all of the alkali components cannot be included as a solid solution with a perovskite structure.

Preferably, L indicates at least one element selected from Y, Er, Ho, Tm, Lu, and Yb. Preferably, R includes at least Nb and further preferably includes Nb as a main component. Here, the "main component" denotes an element accounting for the highest ratio among the elements to be considered R.

Similarly in the second piezoelectric ceramic composition, it is preferable to set the values of x and y for defining the ratios of alkali elements to be in the same ranges as those described above. In addition, with respect to the elements L and R, the same elements as those described above are preferable.

Furthermore, at least one selected from Mn, Cr, and Co may be added to the first piezoelectric ceramic composition so as to have a ratio thereof to the whole of 0.01 to 1 wt % in terms of $MnO_2$, $Cr_2O_3$, and CoO, respectively. The amount of such metal to be added is further preferably at least 0.1 wt % and particularly preferably 0.5 wt % or less.

Figure 1:
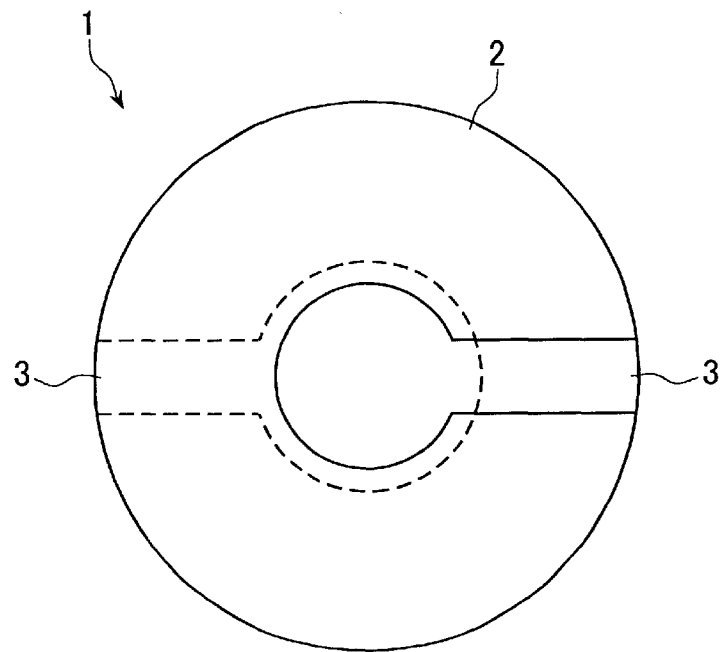
FIG. 1 is a plan view showing an example of a piezoelectric element according to the present invention.

A composition of the present invention can be used, for instance, for an energy-trapping-type resonator as shown in FIG. 1. This piezoelectric element 1 is composed of a piezoelectric ceramics 2 and electrodes 3. For instance, Cr—Au electrodes may be used as the electrodes. Thus, a piezoelectric element used in a high frequency band can be provided.

Figure 2:
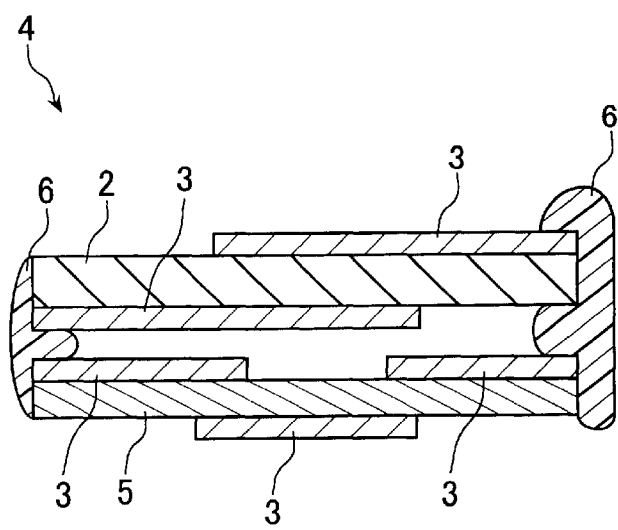
FIG. 2 is a sectional view showing an example of a piezo-resonator according to the present invention.

A composition of the present invention also may be used for a piezo-resonator as shown in FIG. 2. This piezo-resonator 4 includes a capacitative element 5 together with a piezoelectric ceramic 2 and they are connected to each other with an electrically conductive adhesive 6 in the state where electrodes 3 are formed. For example, a barium titanate ceramic can be used as the capacitative element. An adhesive mainly containing silver powder and epoxy resin may be used as the electrically conductive adhesive, for instance. The variation in temperature change rate of capacitance of the capacitative element allows the temperature characteristic of resonant frequency of the piezo-resonator to be controlled. Here, the operation mode of the above-mentioned piezoelectric element and piezo-resonator are not limited to a thickness extensional vibration mode but may be a thickness shear mode.

The piezoelectric ceramic compositions of the present invention are particularly suitable for low-loss resonators used at high frequencies since they have a high mechanical Q and a small grain size. In addition, the frequency constant reaches about 1.5 times that of a conventional lead-zirconate-titanate-based piezoelectric ceramic composition. Hence, in a resonator that is operated in a thickness extensional vibration mode at the same frequency as that used by a conventional resonator, its thickness increases to about 1.5 times the conventional one. Thus, a particularly useful effect can be obtained in the application of the piezoelectric ceramic compositions according to the present invention in a high-frequency band. The piezoelectric ceramic compositions of the present invention have a high coupling coefficient and thus are particularly suitable for various sensors such as an acceleration sensor, actuators, or the like. Furthermore, the piezoelectric ceramic compositions of the present invention do not contain lead and therefore also are preferable from the viewpoint of environmental protection.

EXAMPLE

Example 1

Initially, $Nb_2O_5$, $Li_2CO_3$, $Na_2CO_3$, $K_2CO_3$, $Y_2O_3$, $Er_2O_3$, $Ho_2O_3$, $Tm_2O_3$, $Lu_2O_3$, $Yb_2O_3$, CoO, $Cr_2O_3$, and $Mn_3O_4$ were prepared as raw materials, and powders of raw materials suitably selected from them were weighed to have composition ratios shown in Tables 1 and 2. Next, the raw material powders thus weighed were mixed with ethanol for 20 hours using a ball mill, and then the mixture was dried and was calcined at 750 to 1100° C. for two hours. After being coarsely pulverized, the calcined body thus obtained was further pulverized with ethanol for 15 hours in a ball mill, which then was dried. Afterward, an organic binder was added thereto and the mixture was granulated, which then was formed under a pressure of 70 MPa into a disc-like green compact with a diameter of 13 mm and a thickness of 1 mm. This was sintered at a temperature between 900° C. and 1250° C. for one hour. After sintering, each of the ceramics with the highest density among the respective compositions was ground to have a thickness of 0.35 mm and then Cr—Au was deposited on both faces thereof to form electrodes. This element thus obtained was subjected to polarization through application of a direct electric field of 3 to 7 kV/mm between the electrodes in silicone oil with a temperature of 100 to 200° C. for 30 minutes.

The ceramic compositions prepared by the steps described above were subjected to measurements of average grain size, dielectric constant, thickness-longitudinal-vibration electromechanical coupling coefficient kt, and mechanical Q. The results are shown in Tables 1 and 2.

In the present example, since the ceramic compositions are free from $Bi_{1/2}Na_{1/2}TiO_3$ (w=0), the compositions can be expressed by a formula of $(1-v)[(Li_{1-x-y}Na_xK_y)_zRO_3] \cdot vLMnO_3$. Tables 1 and 2 show the results with respect to a composition containing Li and Na as alkali elements (y=0) and the results with respect to a composition containing Na and K as alkali elements (x+y=1), respectively. The added materials shown in the tables were added so that their ratios to the whole were equal to the values indicated in the tables.

TABLE 1

$(1-v)[(Li_{1-x}Na_x)_zRO_3] \cdot vLMnO_3$

| Sample Nos. | Composition | | | Type of Added Material | v (wt %) | Grain Size [μm] | Dielectric Constant | Coupling Coefficient kt | Mechanical Q |
|---|---|---|---|---|---|---|---|---|---|
| | z | x | L | | | | | | |
| 1* | 0.99 | 0.88 | — | — | — | 46 | 116 | 0.32 | 290 |
| 2 | 0.99 | 0.88 | Y | 0.001 | — | 13 | 121 | 0.35 | 420 |
| 3 | 0.99 | 0.88 | Y | 0.005 | — | 2.3 | 125 | 0.38 | 810 |
| 4# | 0.99 | 0.75 | Y | 0.02 | — | 1.5 | 113 | 0.22 | 160 |

TABLE 1-continued $(1-v)[(Li_{1-x}Na_x)_zRO_3] \cdot vLMnO_3$

| Sample Nos. | Composition z | x | L | v | Type of Added Material (wt %) | Grain Size [μm] | Dielectric Constant | Coupling Coefficient kt | Mechanical Q |
|---|---|---|---|---|---|---|---|---|---|
| 5 | 0.99 | 0.80 | Y | 0.02 | — | 1.4 | 118 | 0.29 | 310 |
| 6 | 0.99 | 0.83 | Y | 0.02 | — | 1.4 | 124 | 0.41 | 430 |
| 7 | 0.99 | 0.88 | Y | 0.02 | — | 1.5 | 133 | 0.44 | 920 |
| 8 | 0.99 | 0.93 | Y | 0.02 | — | 1.6 | 127 | 0.42 | 670 |
| 9 | 0.99 | 0.97 | Y | 0.02 | — | 1.7 | 119 | 0.38 | 460 |
| 10* | 0.99 | 0.99 | Y | 0.02 | — | 2.4 | 105 | 0.22 | 180 |
| 11 | 0.99 | 0.88 | Y | 0.05 | — | 1.4 | 244 | 0.35 | 450 |
| 12* | 0.99 | 0.88 | Y | 0.08 | — | 1.7 | 228 | 0.34 | 290 |
| 13 | 0.99 | 0.88 | Er | 0.01 | — | 3.7 | 111 | 0.39 | 550 |
| 14 | 0.99 | 0.88 | Er | 0.02 | — | 1.1 | 122 | 0.45 | 860 |
| 15 | 0.99 | 0.88 | Ho | 0.005 | — | 5.6 | 115 | 0.41 | 510 |
| 16 | 0.99 | 0.88 | Ho | 0.02 | — | 1.3 | 113 | 0.48 | 790 |
| 17 | 0.99 | 0.88 | Tm | 0.01 | — | 2.5 | 115 | 0.42 | 1020 |
| 18 | 0.99 | 0.88 | Lu | 0.01 | — | 5.1 | 123 | 0.34 | 740 |
| 19 | 0.99 | 0.88 | Yb | 0.02 | — | 2.3 | 119 | 0.48 | 780 |
| 20* | 1.02 | 0.88 | Y | 0.02 | — | 6.2 | 121 | 0.26 | 280 |
| 21 | 1.00 | 0.88 | Y | 0.02 | — | 4.5 | 127 | 0.42 | 820 |
| 22 | 0.98 | 0.88 | Y | 0.02 | — | 5.2 | 117 | 0.39 | 570 |
| 23* | 0.96 | 0.88 | Y | 0.02 | — | 5.5 | 109 | 0.23 | 170 |
| 24 | 0.99 | 0.88 | — | — | MnO$_2$(0.2) | 5.1 | 117 | 0.34 | 420 |
| 25 | 0.99 | 0.88 | — | — | Cr$_2$O$_3$(0.2) | 2.3 | 119 | 0.37 | 370 |
| 26 | 0.99 | 0.88 | — | — | CoO(0.2) | 7.3 | 113 | 0.40 | 380 |
| 27 | 0.99 | 0.88 | Y | 0.001 | MnO$_2$(0.2) | 1.1 | 117 | 0.40 | 1280 |
| 28 | 0.99 | 0.88 | Er | 0.005 | Cr$_2$O$_3$(0.2) | 0.9 | 116 | 0.39 | 1190 |
| 29 | 0.99 | 0.88 | Yb | 0.02 | CoO(0.2) | 1.2 | 121 | 0.42 | 1120 |

TABLE 2

$(1-v)[(Na_xK_y)_zRO_3] \cdot vLMnO_3$ (x + y = 1)

| Sample Nos. | Composition z | y | L | v | Type of Added Material (wt %) | Grain Size [μm] | Dielectric Constant | Coupling Coefficient kt | Mechanical Q |
|---|---|---|---|---|---|---|---|---|---|
| 30* | 0.99 | 0.45 | — | — | — | 17 | 479 | 0.32 | 87 |
| 31 | 0.99 | 0.45 | Y | 0.001 | — | 1.4 | 465 | 0.36 | 220 |
| 32 | 0.99 | 0.45 | Y | 0.005 | — | 1.0 | 473 | 0.41 | 430 |
| 33# | 0.99 | 0.10 | Y | 0.02 | — | 1.8 | 152 | 0.18 | 140 |
| 34 | 0.99 | 0.20 | Y | 0.02 | — | 1.2 | 232 | 0.31 | 370 |
| 35 | 0.99 | 0.40 | Y | 0.02 | — | 0.8 | 392 | 0.35 | 380 |
| 36 | 0.99 | 0.45 | Y | 0.02 | — | 0.6 | 454 | 0.42 | 510 |
| 37 | 0.99 | 0.60 | Y | 0.02 | — | 1.1 | 385 | 0.32 | 360 |
| 38 | 0.99 | 0.80 | Y | 0.02 | — | 1.5 | 214 | 0.25 | 310 |
| 39# | 0.99 | 0.90 | Y | 0.02 | — | 2.2 | 146 | 0.22 | 280 |
| 40 | 0.99 | 0.45 | Y | 0.05 | — | 1.2 | 483 | 0.38 | 380 |
| 41 | 0.99 | 0.45 | Er | 0.01 | — | 1.8 | 492 | 0.46 | 330 |
| 42 | 0.99 | 0.45 | Er | 0.02 | — | 0.5 | 481 | 0.41 | 420 |
| 43 | 0.99 | 0.45 | Ho | 0.01 | — | 1.9 | 509 | 0.37 | 220 |
| 44 | 0.99 | 0.45 | Ho | 0.02 | — | 0.9 | 501 | 0.35 | 310 |
| 45 | 0.99 | 0.45 | Tm | 0.01 | — | 1.5 | 488 | 0.42 | 450 |
| 46 | 0.99 | 0.45 | Lu | 0.02 | — | 1.1 | 494 | 0.37 | 390 |
| 47 | 0.99 | 0.45 | Yb | 0.02 | — | 0.8 | 499 | 0.38 | 380 |
| 48 | 1.00 | 0.45 | Yb | 0.02 | — | 2.5 | 512 | 0.36 | 220 |
| 49 | 0.98 | 0.45 | Yb | 0.02 | — | 4.1 | 487 | 0.34 | 230 |
| 50 | 0.99 | 0.45 | — | — | MnO$_2$(0.2) | 2.8 | 475 | 0.37 | 420 |
| 51 | 0.99 | 0.45 | — | — | Cr$_2$O$_3$(0.2) | 2.1 | 491 | 0.34 | 230 |
| 52 | 0.99 | 0.45 | — | — | CoO(0.2) | 3.3 | 499 | 0.38 | 260 |
| 53 | 0.99 | 0.45 | Y | 0.02 | MnO$_2$(0.2) | 0.6 | 487 | 0.44 | 780 |
| 54 | 0.99 | 0.45 | Er | 0.02 | Cr$_2$O$_3$(0.2) | 0.7 | 501 | 0.43 | 650 |
| 55 | 0.99 | 0.45 | Yb | 0.02 | CoO(0.2) | 0.6 | 512 | 0.42 | 510 |

In Tables 1 and 2, the samples indicated with the mark * are piezoelectric ceramic compositions of comparative examples that are out of the range of the present invention. In the samples indicated with the mark #, the values of x and y are out of the preferable ranges.

All the above-mentioned samples had a frequency constant Nt of thickness longitudinal vibration in a range of 2700 to 3200 Hz·m. This corresponds to about 1.5 times the value of conventional lead-zirconate-based piezoelectric ceramics.

As is apparent from the aforementioned results, with the application of the present invention, piezoelectric ceramic compositions were obtained that had an average grain size of 15 μm or less, preferably 10 μm or less, and a mechanical Q of at least 200, preferably at least 300.

Example 2

Initially, $Li_2CO_3$, $Na_2CO_3$, $Nb_2O_5$, $Y_2O_3$, $Er_2O_3$, $Ho_2O_3$, $Tm_2O_3$, $Lu_2O_3$, $Yb_2O_3$, $Bi_2O_3$, $TiO_2$, $CoO$, $Cr_2O_3$, and $Mn_3O_4$ were prepared as raw materials, and powders of raw materials suitably selected from them were weighed to have composition ratios shown in Table 3. Next, the raw material powders thus weighed were mixed with ethanol for 20 hours using a ball mill, and then the mixture was dried at 120° C. for 15 hours and was calcined at 1000° C. for two hours. After being coarsely pulverized, the calcined body thus obtained was further pulverized with ethanol for 15 hours in a ball mill, which then was dried at 120° C. for 15 hours. Afterward, an organic binder was added thereto and the mixture was granulated, which then was formed under a pressure of 70 MPa into a disc-like green compact with a diameter of 13 mm and a thickness of 1 mm. This was sintered at a temperature between 1000° C. and 1250° C. for one hour. After sintering, each of the ceramics with the highest density among the respective compositions was ground to have a thickness of 0.35 mm and then Cr—Au was deposited on both faces thereof to form electrodes. This element thus obtained was subjected to polarization through application of a direct electric field of 4 kV/mm between the electrodes in silicone oil with a temperature of 150° C. for 30 minutes.

The piezoelectric ceramic compositions prepared by the steps described above were subjected to measurements of average grain size, dielectric constant, thickness-longitudinal-vibration electromechanical coupling coefficient kt, and mechanical Q. The results are shown in Table 3. The added materials shown in the table were added so that their ratios to the whole were equal to the values indicated in the table.

TABLE 3

$(1 - v - w)[(Li_{1-x-y}Na_xK_y)_zRO_3] \cdot vLMnO_3 \cdot wBi_{1/2}Na_{1/2}TiO_3$

| Sample Nos. | Composition | | | | Type of Added Material (wt %) | Grain Size [μm] | Dielectric Constant | Coupling Co-efficient kt | Mechanical Q |
|---|---|---|---|---|---|---|---|---|---|
| | z | x | W | L | v | | | | |
| 56* | 0.99 | 0.88 | — | — | — | — | 46 | 116 | 0.32 | 290 |
| 57 | 0.99 | 0.88 | 0.001 | — | — | — | 13 | 109 | 0.32 | 340 |
| 58 | 0.99 | 0.88 | 0.005 | — | — | — | 6.5 | 119 | 0.33 | 380 |
| 59 | 0.99 | 0.88 | 0.02 | — | — | — | 4.5 | 186 | 0.34 | 420 |
| 60 | 0.99 | 0.88 | 0.05 | — | — | — | 2.5 | 228 | 0.37 | 450 |
| 61 | 0.99 | 0.88 | 0.1 | — | — | — | 2.1 | 213 | 0.35 | 610 |
| 62 | 0.99 | 0.88 | 0.2 | — | — | — | 0.9 | 280 | 0.33 | 520 |
| 63* | 0.99 | 0.88 | 0.25 | Y | 0.02 | — | 1.3 | 354 | 0.32 | 260 |
| 64 | 0.99 | 0.88 | 0.1 | Y | 0.001 | — | 1.6 | 192 | 0.36 | 740 |
| 65 | 0.99 | 0.88 | 0.1 | Y | 0.005 | — | 1.2 | 208 | 0.38 | 1050 |
| 66 | 0.99 | 0.88 | 0.1 | Y | 0.02 | — | 1.0 | 221 | 0.40 | 1100 |
| 67 | 0.99 | 0.88 | 0.1 | Y | 0.05 | — | 1.1 | 246 | 0.36 | 630 |
| 68 | 0.99 | 0.88 | 0.1 | Er | 0.01 | — | 1.0 | 223 | 0.40 | 870 |
| 69 | 0.99 | 0.88 | 0.1 | Er | 0.02 | — | 0.8 | 241 | 0.43 | 930 |
| 70 | 0.99 | 0.88 | 0.1 | Ho | 0.01 | — | 1.7 | 214 | 0.38 | 890 |
| 71 | 0.99 | 0.88 | 0.1 | Ho | 0.02 | — | 1.2 | 257 | 0.46 | 1110 |
| 72 | 0.99 | 0.88 | 0.1 | Tm | 0.01 | — | 1.6 | 222 | 0.43 | 1420 |
| 73 | 0.99 | 0.88 | 0.1 | Lu | 0.01 | — | 1.5 | 235 | 0.37 | 850 |
| 74 | 0.99 | 0.88 | 0.1 | Yb | 0.02 | — | 1.0 | 231 | 0.46 | 1030 |
| 75 | 1.00 | 0.88 | 0.05 | — | — | — | 2.4 | 209 | 0.33 | 430 |
| 76 | 0.98 | 0.88 | 0.05 | — | — | — | 2.1 | 212 | 0.35 | 520 |
| 77 | 0.99 | 0.88 | 0.1 | — | — | $MnO_2$ (0.2) | 0.9 | 215 | 0.34 | 1150 |
| 78 | 0.99 | 0.88 | 0.1 | — | — | $Cr_2O_3$ (0.2) | 1.3 | 224 | 0.36 | 850 |
| 79 | 0.99 | 0.88 | 0.1 | — | — | CoO (0.2) | 1.7 | 237 | 0.40 | 890 |
| 80 | 0.99 | 0.88 | 0.05 | Y | 0.02 | $MnO_2$ (0.2) | 1.1 | 171 | 0.41 | 1430 |
| 81 | 0.99 | 0.88 | 0.05 | Er | 0.02 | $Cr_2O_3$ (0.2) | 1.0 | 232 | 0.41 | 1280 |
| 82 | 0.99 | 0.88 | 0.05 | Yb | 0.02 | CoO (0.2) | 1.4 | 263 | 0.40 | 1320 |

All the above-mentioned samples had a frequency constant Nt of thickness longitudinal vibration in a range of 2700 to 3200 Hz·m. This corresponds to about 1.5 times the value of conventional lead-zirconate-based piezoelectric ceramics.

As is apparent from the aforementioned results, with the application of the present invention, piezoelectric ceramic compositions were obtained that had an average grain size of 13 m or less, preferably 10 Am or less, and a mechanical Q of at least 300.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A piezoelectric ceramic composition, expressed by a formula of $(1-v-w)[Li_{1-x-y}Na_xK_y)_zRO_3]\cdot vLMnO_3\cdot wBi_{1/2}Na_{1/2}TiO_3$, wherein $0 \leq v \leq 0.05$, $0 \leq w \leq 0.2$, $v+w>0$, $0.2 \leq x \leq 0.97$, $0 \leq y \leq 0.8$, $0.98 \leq z \leq 1$, L indicates at least one element s elected from rare earth elements, and R denotes at least one element selected from Nb, Ta, and Sb.

2. The piezoelectric ceramic composition according to claim 1, wherein $0.010 \leq v \leq 0.05$.

3. The piezoelectric ceramic composition according to claim 2, wherein w=0.

4. The piezoelectric ceramic composition according to claim 1, wherein $0.001 \leq w \leq 0.2$.

5. The piezoelectric ceramic composition according to claim 4, wherein v=0.

6. The piezoelectric ceramic composition according to claim 1, wherein $0.001 \leq v \leq 0.05$ and $0.001 \leq w \leq 0.2$.

7. The piezoelectric ceramic composition according to claim 1, wherein $0.80 \leq x \leq 0.97$ and y=0.

8. The piezoelectric ceramic composition according to claim 1, wherein $0.2 \leq x \leq 0.8$, $0.2 \leq y \leq 0.8$, and x+y=1.

9. The piezoelectric ceramic composition according to claim 1, wherein L indicates at least one element selected from Y, Er, Ho, Tm, Lu, and Yb.

10. The piezoelectric ceramic composition according to claim 1, wherein R comprises Nb.

11. The piezoelectric ceramic composition according to claim 1, wherein the piezoelectric ceramic composition comprises at least one selected from Mn, Cr, and Co that is added thereto so as to have an amount thereof to the whole of 0.01 to 1 wt % in terms of $MnO_2$, $Cr_2O_3$, and CoO, respectively.

12. A piezoelectric ceramic composition, comprising at least one selected from Mn, Cr, and Co that is added to a composition expressed by a formula of $(Li_{1-x-y}Na_xK_y)_zRO_3$ so as to have an amount thereof to the whole of 0.01 to 1 wt % in terms of $MnO_2$, $Cr_2O_3$, and CoO, respectively, wherein $0.2 \leq x \leq 0.97$, $0 \leq y \leq 0.8$, $x+y \geq 0.8$, $0.98 \leq z \leq 1$, and R denotes at least one element selected from Nb, Ta, and Sb.

13. The piezoelectric ceramic composition according to claim 12, wherein $0.80 \leq x \leq 0.97$ and y=0.

14. The piezoelectric ceramic composition according to claim 12, wherein $0.2 \leq x \leq 0.8$, $0.2 \leq y \leq 0.8$, and x+y=1.

15. The piezoelectric ceramic composition according to claim 12, wherein R comprises Nb.

16. A piezoelectric element, comprising a piezoelectric ceramic composition according to claim 1.

17. The piezoelectric element according to claim 16, further comprising a capacitative element.

18. A piezoelectric element, comprising a piezoelectric ceramic composition according to claim 12.

19. The piezoelectric element according to claim 18, further comprising a capacitative element.

* * * * *

UNITED STATES PATENT AND TRADEMARK OFFICE
CERTIFICATE OF CORRECTION

PATENT NO. : 6,514,427 B2
DATED : February 4, 2003
INVENTOR(S) : Nishida et al.

It is certified that error appears in the above-identified patent and that said Letters Patent is hereby corrected as shown below:

Title page,
Item [57], ABSTRACT,
Line 6, "$[(Li_{1-x-y}Na_xK_y)_zRO_3].vLMnO_3.wBi_{1/2}Na_{1/2}TiO_3.$" should read -- $[(Li_{1-x-y}Na_xK_y)_zRO_3] \cdot vLMnO_3 \cdot wBi_{1/2}Na_{1/2}TiO_3.$ --

Line 13, "$0 \leq 0.2$," should read -- $0 \leq w \leq 0.2.$ --

Column 9,
Line 24, "$[Li_{1-x-y}Na_xK_y)_zRO_3].vLMnO_3.wBi_{1/2}Na_{1/2}TiO_3$" should read -- $[(Li_{1-x-y}Na_xK_y)_zRO_3] \cdot vLMnO_3 \cdot wBi_{1/2}Na_{1/2}TiO_3$ --

Line 26, "$0.2 \leq x \leq 0.97, 0 \leq y \leq 0.8, 0.98 \leq z \leq 1,$" should read -- $0.2 \leq x \leq 0.97, 0 \leq y \leq 0.8, x+y \geq 0.8, 0.98 \leq z \leq 1,$ --

Line 27, "element s elected" should read -- element selected --
Line 30, "claim 1, wherein $0.010 \leq v \leq 0.05$." should read -- claim 1, wherein $0.0010 \leq 0.05.$ --

Signed and Sealed this

Sixteenth Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,514,427 B2
DATED : February 4, 2003
INVENTOR(S) : Nishida et al.

It is certified that error appears in the above-identified patent and that said Letters Patent is hereby corrected as shown below:

<u>Title page,</u>
Item [57], ABSTRACT,
Line 6, "$[(Li_{1-x-y}Na_xK_y)_zRO_3].vLMnO_3.wBi_{1/2}Na_{1/2}TiO_3.$" should read
-- $[(Li_{1-x-y}Na_xK_y)_zRO_3] \cdot vLMnO_3 \cdot wBi_{1/2}Na_{1/2}TiO_3.$ --

Line 13, "$0 \leq 0.2$," should read -- $0 \leq w \leq 0.2$, --

<u>Column 9,</u>
Line 24, "$[Li_{1-x-y}Na_xK_y)_zRO_3].vLMnO_3.wBi_{1/2}Na_{1/2}TiO_3$" should read
-- $[(Li_{1-x-y}Na_xK_y)_zRO_3] \cdot vLMnO_3 \cdot wBi_{1/2}Na_{1/2}TiO_3$ --
Line 26, "$0.2 \leq x \leq 0.97, 0 \leq y \leq 0.8, 0.98 \leq z \leq 1$," should read -- $0.2 \leq x \leq 0.97, 0 \leq y \leq 0.8, x+y \geq 0.8, 0.98 \leq z \leq 1$, --
Line 27, "element s elected" should read -- element selected --
Line 30, "claim 1, wherein $0.010 \leq v \leq 0.05$." should read -- claim 1, wherein $0.0010 \leq v \leq 0.05$. --

This certificate supersedes Certificate of Correction issued March 16, 2004.

Signed and Sealed this

Third Day of August, 2004

JON W. DUDAS
*Acting Director of the United States Patent and Trademark Office*